United States Patent
Lee et al.

(10) Patent No.: US 9,437,266 B2
(45) Date of Patent: Sep. 6, 2016

(54) UNIPOLAR PROGRAMMABLE METALLIZATION CELL

(71) Applicants: Feng-Ming Lee, Changhua (TW); Yu-Yu Lin, Taipei (TW); Ming-Hsiu Lee, Hsinchu (TW)

(72) Inventors: Feng-Ming Lee, Changhua (TW); Yu-Yu Lin, Taipei (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 546 days.

(21) Appl. No.: 13/675,923

(22) Filed: Nov. 13, 2012

(65) Prior Publication Data

US 2014/0131653 A1 May 15, 2014

(51) Int. Cl.
*H01L 45/00* (2006.01)
*G11C 11/00* (2006.01)
*H01L 27/24* (2006.01)

(52) U.S. Cl.
CPC ............ *G11C 11/00* (2013.01); *H01L 45/085* (2013.01); *H01L 45/1233* (2013.01); *H01L 45/1266* (2013.01); *H01L 45/145* (2013.01); *H01L 27/2409* (2013.01)

(58) Field of Classification Search
CPC ............ H01L 45/085; H01L 45/1608; H01L 27/2409; H01L 27/1233
See application file for complete search history.

(56) References Cited

U.S. PATENT DOCUMENTS

| | | | |
|---|---|---|---|
| 6,849,905 B2 | 2/2005 | Ilkbahar et al. | |
| 7,071,021 B2 | 7/2006 | Harshfield et al. | |
| 7,236,394 B2 | 6/2007 | Chen et al. | |
| 8,134,139 B2 | 3/2012 | Lin et al. | |
| 8,426,839 B1 | 4/2013 | Ma et al. | |
| 8,605,495 B2 | 12/2013 | Lung | |
| 2004/0238958 A1 | 12/2004 | Moore et al. | |
| 2006/0054823 A1 | 3/2006 | Yon et al. | |
| 2006/0097341 A1 | 5/2006 | Pellizzer et al. | |
| 2009/0290266 A1 | 11/2009 | Dieny et al. | |
| 2009/0290407 A1 | 11/2009 | Mouli | |
| 2010/0059808 A1 | 3/2010 | Zheng et al. | |
| 2011/0001115 A1* | 1/2011 | Greene et al. | 257/4 |
| 2011/0180775 A1* | 7/2011 | Lin et al. | 257/4 |
| 2012/0044746 A1* | 2/2012 | Chung | 365/148 |
| 2012/0091420 A1 | 4/2012 | Kusai et al. | |

(Continued)

OTHER PUBLICATIONS

U.S. Appl. No. 13/103,887, filed May 9, 2011 entitled "Isolation Device Free Memory".

(Continued)

*Primary Examiner* — Kimberly Rizkallah
*Assistant Examiner* — Mounir Amer
(74) *Attorney, Agent, or Firm* — Haynes Beffel & Wolfeld LLP

(57) ABSTRACT

A programmable metallization device comprises a first electrode and a second electrode, and a dielectric layer, a conductive ion-barrier layer, and an ion-supplying layer in series between the first and second electrodes. In operation, a conductive bridge is formed or destructed in the dielectric layer to represent a data value using bias voltages having the same polarity, enabling the use of diode access devices. To form a conductive bridge, a bias is applied that is high enough to cause ions to penetrate the conductive ion-barrier layer into the dielectric layer, which then form filaments or bridges. To destruct the conductive bridge, a bias of the same polarity is applied that causes current to flow through the structure, while ion flow is blocked by the conductive ion-barrier layer. As a result of Joule heating, any bridge in the dielectric layer disintegrates.

13 Claims, 6 Drawing Sheets

(56) References Cited

U.S. PATENT DOCUMENTS

2012/0188813 A1 7/2012 Chien et al.
2013/0182487 A1 7/2013 Lee et al.
2014/0131653 A1 5/2014 Lee et al.

OTHER PUBLICATIONS

Li F., et al., "Evaluation of SiO2 Antifuse ina 3D-OTP Memory," IEEE Transaction on Device and Materials Reliability, vol. 4, No. 3, 2004, pp. 416-421.

Sasago Y., et al., "Cross-point phase change memory with 4F2 cell size driven by low-contact-resistivity poly-Si diode," 2009 Symposium on VLSI Technology Digest of Tech. Papers, pp. 24-25.

Kau DC, et al., "A stackable cross point phase change memory," 2009 International Electron Devices Meeting, Baltimore MD, pp. 27.1.1-27.1.4.

Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.

* cited by examiner

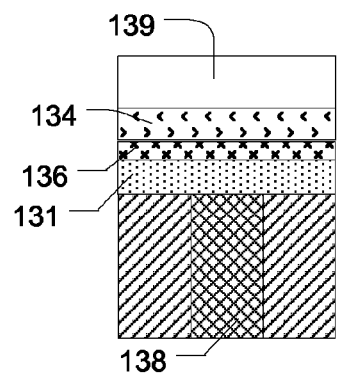
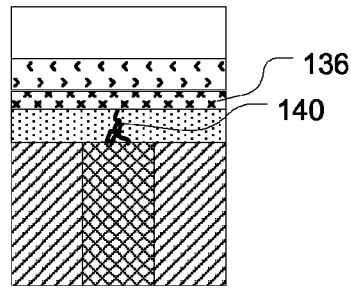
Fig. 2a    Fig. 2b    Fig. 2c
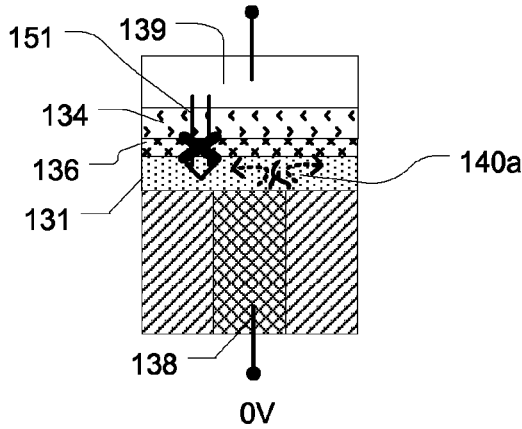
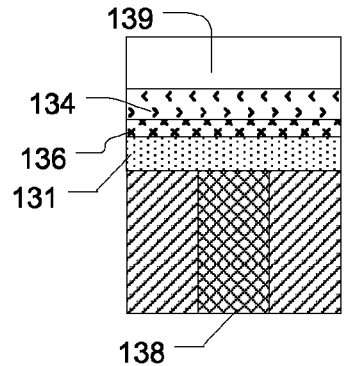
Fig. 3a    Fig. 3b

UNIPOLAR PROGRAMMABLE METALLIZATION CELL

BACKGROUND OF THE INVENTION

1. Field of the Invention

The present invention relates to programmable metallization cell (PMC) technology.

2. Description of Related Art

Programmable Metallization Cell (PMC) technology is being investigated for use in nonvolatile memory, reconfigurable logic, and other switching applications due to its low current, good scalability, and high programming speed. The resistance switching of PMC devices is manifested by growing and removing conducting bridges through an electrochemical or electrolytic process. Therefore, PMC devices have also been referred to as conducting bridge (CB) devices or electrochemical (EC) devices.

PMC devices have an ON state in which the conductive bridge completes a current path between electrodes, and an OFF state in which the conductive bridge is reduced such that it does not complete a current path between the electrodes. Such PCM cells have a bipolar operating characteristic. As a result, when arranged in a memory array, underlying transistors are required to prevent current flow from unselected cells in the ON state from interfering with read operations, and other operations on selected cells. Where transistors are required access devices, the density of the array is reduced, and the peripheral circuitry is complex.

Many three-dimensional (3D) memory concepts have been proposed in order to make high density memory. Li et al., "Evaluation of SiO2 Antifuse in a 3D-OTP Memory," IEEE TRANSACTIONS ON DEVICE AND MATERIALS RELIABILITY, VOL. 4, NO. 3, SEPTEMBER 2004, describes a polysilicon diode and an anti-fuse arranged as a memory cell. Sasago et al., "Cross-point phase change memory with $4F^2$ cell size driven by low-contact-resistivity poly-Si diode," 2009 Symposium on VLSI Technology Digest of Technical Papers, pages 24-25, describes a polysilicon diode and a phase change element arranged as a memory cell. Kau et al., "A stackable cross point phase change memory," IEDM09-617, (2009) pages 27.1.1 to 27.1.4, describes a memory cell including an ovonic threshold switch OTS as an isolation device with a phase change element. These technologies rely on a combination of an isolation device and a memory element to construct the memory cell. The isolation device adds extra processes and thickness and/or area to the memory structure. Also, the isolation device/memory element approach is not suitable for many 3D memory structures, including so called Bit Cost Scalable BiCS structures and other 3D memory structures that include a large number of memory layers.

In Chen et al., "An Access-Transistor-Free (0T/1R) Non-Volatile Resistance Random Access Memory (RRAM) Using a Novel Threshold Switching, Self-Rectifying Chalcogenide Device," IEDM 03-905, (2003), pages 37.4.1 to 37.4.4, a so-called zero transistor/one resistor 0T/1R memory cell is described using a phase change element that does not include a separate isolation device. (See, also, U.S. Pat. No. 7,236,394).

Therefore, it is desirable to provide a memory technology that is suitable for high density structures, and is easily manufactured.

SUMMARY OF THE INVENTION

A memory device suitable for unipolar operation is described, which comprises a programmable metallization cell (PMC) having a thermal reset structure. The device includes a first electrode and a second electrode, a dielectric layer, a conductive ion-barrier layer, and an ion-supplying layer in series between the first and second electrodes, the ion-supplying layer containing a source of ions of a material suitable for formation of conductive bridges through the dielectric layer. The conductive ion-barrier layer comprises a material to block ion diffusion from the ion-supplying layer to the dielectric layer during reset operations, while allowing sufficient ion diffusion from the ion-supplying layer to the dielectric layer for formation of conductive bridges during the set operations. The dielectric layer comprises a material or materials supporting electrolytic formation of conducting bridges therethrough using ions from the ion-supplying layer. A device including the memory cell can have supporting circuitry to apply a first bias condition having a polarity between the first and second electrodes to induce creation of conducting bridges within the dielectric layer, and a second bias condition having said polarity to induce thermal disintegration of bridges in the dielectric layers.

Memory devices of this type can be arranged in an array, and circuitry can be coupled to the array to apply bias voltages to the first and second electrodes to set the memory structure in the set state to represent a first data value, and to set the memory structure in the reset state to represent a second data value. To sense the data value, a read bias condition is applied inducing a voltage or current level between the thresholds for the set and reset states.

The array can take the form of a cross-point array, with memory cells and corresponding diode access devices formed at interfaces in the cross-points of a plurality of word lines and a plurality of bit lines. The array can comprise a plurality of two-dimensional cross-point arrays stacked in a three-dimensional array.

Other aspects and advantages of the present invention can be seen on review of the drawings, the detailed description, and the claims which follow.

BRIEF DESCRIPTION OF THE DRAWINGS

FIGS. 2a-2c illustrate a set operation for a PMC cell like that shown in FIG. 1.

FIGS. 3a-3b illustrate a reset operation for a PMC cell like that shown in FIG. 1.

DETAILED DESCRIPTION

A detailed description of embodiments of the present invention is provided with reference to the FIGS. 1-7.

Figure 1:
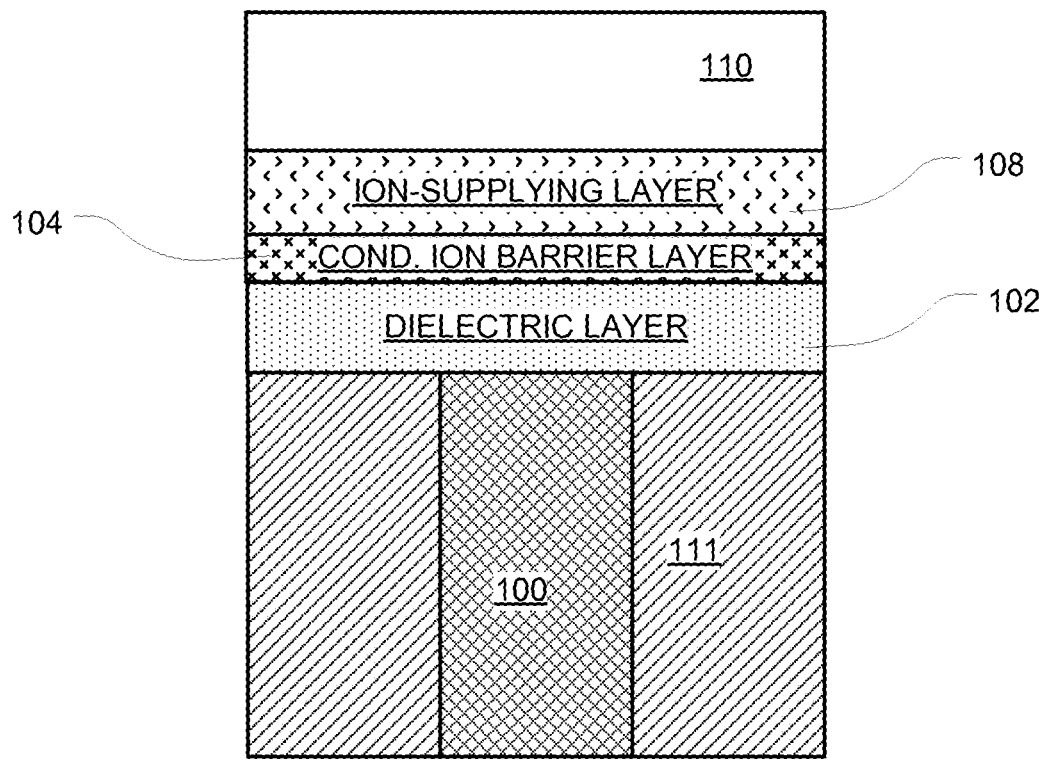
FIG. 1 is a cross-sectional view of a PMC cell including a thermal reset structure.

FIG. 1 illustrates a cross-sectional view of a PMC cell including a thermal reset structure. The PMC cell includes a first electrode 100, which in this example comprises a plug within a via through an interlayer dielectric 111. The cell includes a dielectric layer 102 overlying and contacting the first electrode 100. The dielectric layer 102 can be comprised of any dielectric material that is suitable for allowing the diffusion of conductive ions through the layer, and formation of a conductive bridge through the PMC cell. Such dielectric layers can be silicon dioxide, silicon nitride, silicon oxynitride, metal oxides, high-K dielectric materials and other materials that can support electrolytic formation and destruction of conducting bridges therethrough.

A conductive ion-barrier layer 104 overlies the dielectric layer 102. The conductive ion-barrier layer 104 comprises a material tending to block ion diffusion. The conductive ion-barrier layer 104 is configured so that at a first bias condition causing a relatively high magnitude electric field, sufficient ions pass through to support formation of conductive bridges in the dielectric layer 102, and under a second bias condition causing a lower magnitude electric field, ions are blocked while current flows through the structure to induce thermal disintegration of conductive bridges in the dielectric layer 102.

An ion-supplying layer 108 overlies the conductive ion-barrier layer 104 to provide a source of ions for formation of the conductive bridge through the dielectric layer 102. The ion-supplying layer 108 can be comprised of a chalcogenide layer, such as $Ge_xSe_yTe_z$, where x, y and z can be 2, 2 and 5 for example, that also includes metal such as copper. A copper metal can react with the tellurium in the chalcogenide to form a Cu—Te compound, such as CuTe or $Cu_2Te$. Other materials supporting Cu—Te compounds can be used as well. Such Cu—Te can readily dissolve to release copper ions that can diffuse into the dielectric layer 102, thereby leading to the formation of a conductive bridge, or filament, within the memory cell. For embodiments using aluminum ions, the ion-supplying layer 108 can comprise aluminum metal.

Suitable materials for the conductive ion-barrier layer 104 include nitrogen-containing conductive materials, like metal nitrides. For example, titanium nitride, tungsten nitride and tantalum nitride are suitable materials. In one embodiment, in which the ion-supplying layer is a source of copper ions, the conductive ion-barrier layer 104 is titanium nitride having a thickness around 3 to 6 nanometers. If the thickness of the conductive ion-barrier layer 104 is too small, then unipolar reset by thermal disintegration, as described herein, is not possible as it will not effectively block the passage of ions into the dielectric layer. If the thickness of the conductive ion-barrier layer 104 is too large, the set operation will be prevented or too slow. Thus, the thickness can be determined empirically for each combination of materials.

A second electrode 110 overlies the ion-supplying layer 108. The second electrode 110 can consist of a patterned copper metallization element or any other metallization technology compatible with the adjacent layers.

A first bias condition having a first polarity can be applied across the PMC cell between the first electrode 100 and the second electrode 110 that causes the ions supplied by the ion-supplying layer 108 to migrate into the dielectric layer 102 through the conductive ion-barrier layer 104, and create a conductive bridge through a process like electrochemical deposition. The conductive bridge can grow sufficiently to connect the first electrode 100 to the conductive ion-barrier layer 104 such that the conductive bridge extends through the dielectric layer 102. Such conductive bridge establishes a first resistive state within the PMC cell having a relatively low resistance between the first electrode 100 and the second electrode 110. The resistance state in which the conductive bridge is present can be referred to as the "set" state for the memory cell.

A second bias condition having the same "first" polarity can be applied across the PMC cell between the first electrode 100 and the second electrode 110, causing a current flow and resulting resistive Joule heating in the dielectric layer 102. The resistive heating induces a thermal disintegration of the conductive bridge, as the ions dissolve and dissociate from the bridge. The second bias condition is configured to induce a lower voltage across the structure than the first bias condition. As a result of the second bias condition, the conductive ion-barrier layer 104 allows the current flow while preventing sufficient numbers of ions from migrating from the ion-supplying layer 108 into the dielectric layer 102 to maintain the bridge. The resistive heating induces a thermal disintegration of the conductive bridge, establishing a second resistance state within the PMC cell having a relatively high resistance between the first electrode 100 and the second electrode 110. The resistance state in which the conductive bridge is not present can be referred to as the "reset" state for the memory cell.

FIGS. 2a-2c illustrate a sequence of stages or conditions of a memory cell of the configuration shown in FIG. 1 traversed during a "set" operation of the cell to establish the set state in a cell initially in the reset state. FIG. 2a illustrates the PMC cell in a high resistance, first condition, before a conductive bridge is formed. The first condition corresponds with a first data value for the cell. As with the PMC cell configuration shown in FIG. 1, the PMC cell includes dielectric layer 131, which overlies and makes electrical contact with a first electrode 138. A first ion-supplying layer 134 overlies the dielectric layer 131. The intermediate conductive ion-barrier layer 136 is disposed between the dielectric layer 131 and the ion-supplying layer 134. A second electrode 139 overlies and makes electrical contact with the ion-supplying layer 134. The cell shown in FIG. 2a is in the reset condition in which a conductive bridge is not present through dielectric layer 131 within the cell.

FIG. 2b illustrates the cell during application of a set bias condition, represented by arrow 150, having a first polarity, to change the cell from the reset state of FIG. 2a to a set state. In the illustrated example, the bias voltage includes applying about 4.5 volts to the second electrode 139, and about 0 volts or ground, to the first electrode 138. This creates an electric field tending to drive positive metal ions to the first electrode, where they can be reduced to metallic form. Thus, application of a bias voltage between the first and second electrodes 138 and 139 leads to the formation of a conductive bridge 140 across the dielectric layer 131 by the migration of metal ions into the dielectric layer 131 in a process like electrochemical or electrolytic deposition. The conductive bridge 140 grows sufficiently such that the conductive bridge 140 in the dielectric layer 131 contacts the intermediate conductive ion-barrier layer 136. As a result, the cell assumes a relatively low resistance in the set state.

FIG. 2c illustrates the cell after the set bias condition that is applied during the set operation is changed to a neutral bias condition. In the neutral bias condition, the conductive bridge 140 in the dielectric layer 131, establishes a relatively low resistance connection between the first and second electrodes, and can be used to represent a data value.

FIGS. 3a and 3b illustrate operation during application of a reset bias condition, represented by arrow 151. In the illustrated example, the bias voltage for reset includes applying about 2 volts to the second electrode 139, and about 0 volts or ground, to the first electrode 138. This creates an electric field tending to drive positive metal ions toward the first electrode 138. However, as indicated in FIG. 3a by the "X," in this reset bias condition, the conductive ion-barrier layer 136 blocks ion movement into the dielectric layer 131, preventing maintenance of the conductive bridge. Also, during this reset bias condition, electric current flows, causing resistive Joule heating in the dielectric layer, causing thermal disintegration of the bridge, as represented by the symbol 140a. The heat in the dielectric layer under conditions blocking ion flow from the ion-supplying layer, leads eventually to a break in the conductive path and a relatively high resistance condition or reset state, as illustrated by FIG. 3b.

In this embodiment, the set bias and the reset bias applied between the first electrode and the second electrode both are positive. The PMC cell in this embodiment has a unipolar operation characteristic. In other words, the current is driven in the same direction, from the second electrode to the first electrode, under the set operation and the reset operation.

Figure 4:
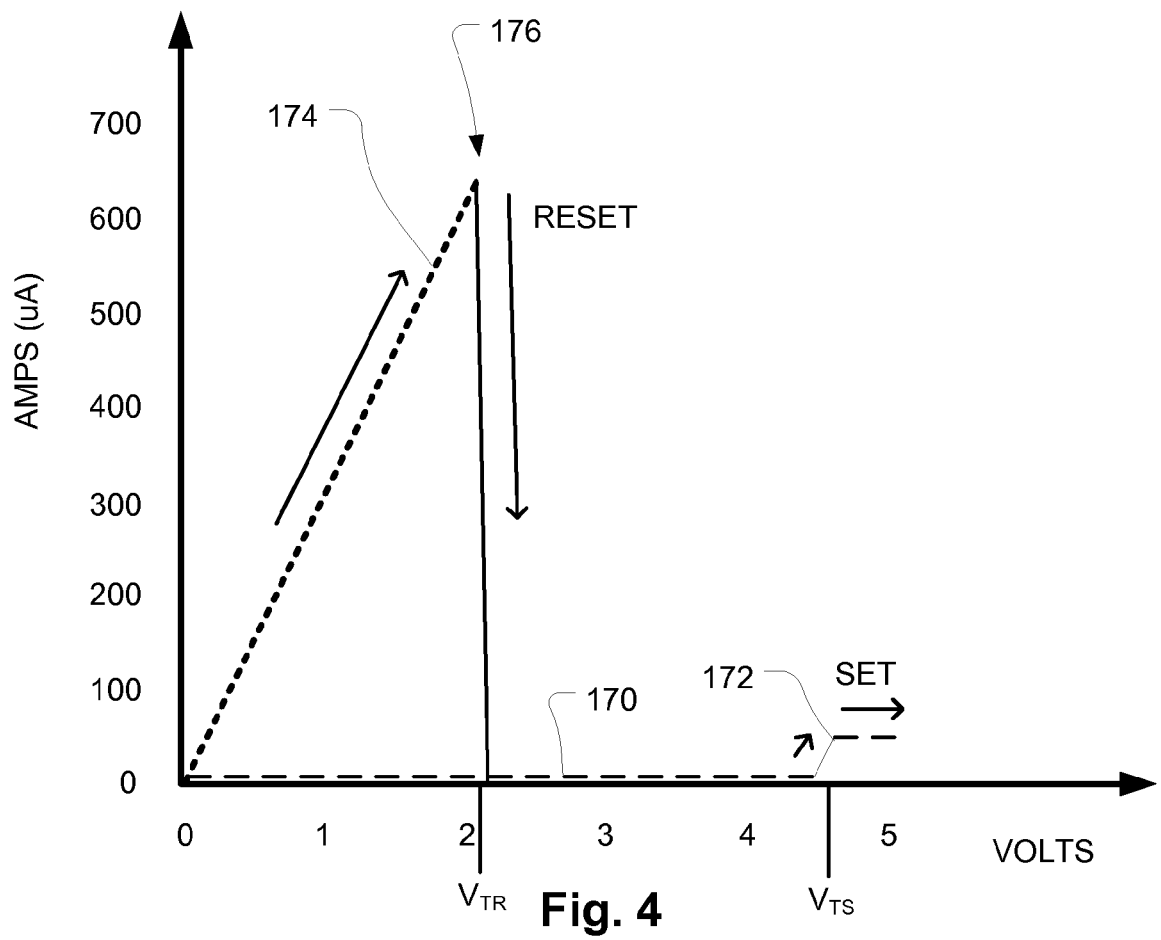
FIG. 4 is a graph of the current as a function of the voltage applied across a PMC cell with a thermal reset structure.

FIG. 4 is a graph of the current as a function of the voltage (I-V characteristic) applied across a PMC cell, like the cell shown in FIG. 1. Line 170 represents the current-voltage characteristics of a cell that starts in the high resistance, or reset state, as a bias condition is applied including a positive voltage at the top electrode and ground at the bottom electrode. As the voltage increases, the current through the cell remains very low. Eventually, ions from the ion-supplying layer begin to penetrate the ion-barrier layer. When the threshold $V_{TS}$ is reached, which in this example is about 4.6 V, or otherwise sufficient ions have been delivered for formation of the conductive bridge, resistance of the cell drops at the location at which line 170 transitions to line 172 in FIG. 4, thereby achieving a conductive condition, or set state.

For a cell starting in the low resistance set state, with a conductive bridge in the dielectric layer, the I-V characteristic for increasing voltage is shown on trace 174. As the voltage increases, the current through the cell increases causing Joule heating in the dielectric layer. When sufficient thermal power has been applied, while ions from the ion-supplying layer remain blocked, the conductive bridge disintegrates. In FIG. 4, this condition is reached at point 176 at threshold voltage $V_{TR}$, where the resistance of the cell increases and the current through the cell drops.

It can be seen in FIG. 4, that a read voltage can be quite low, on the order of 1 V, for example.

Figure 5:
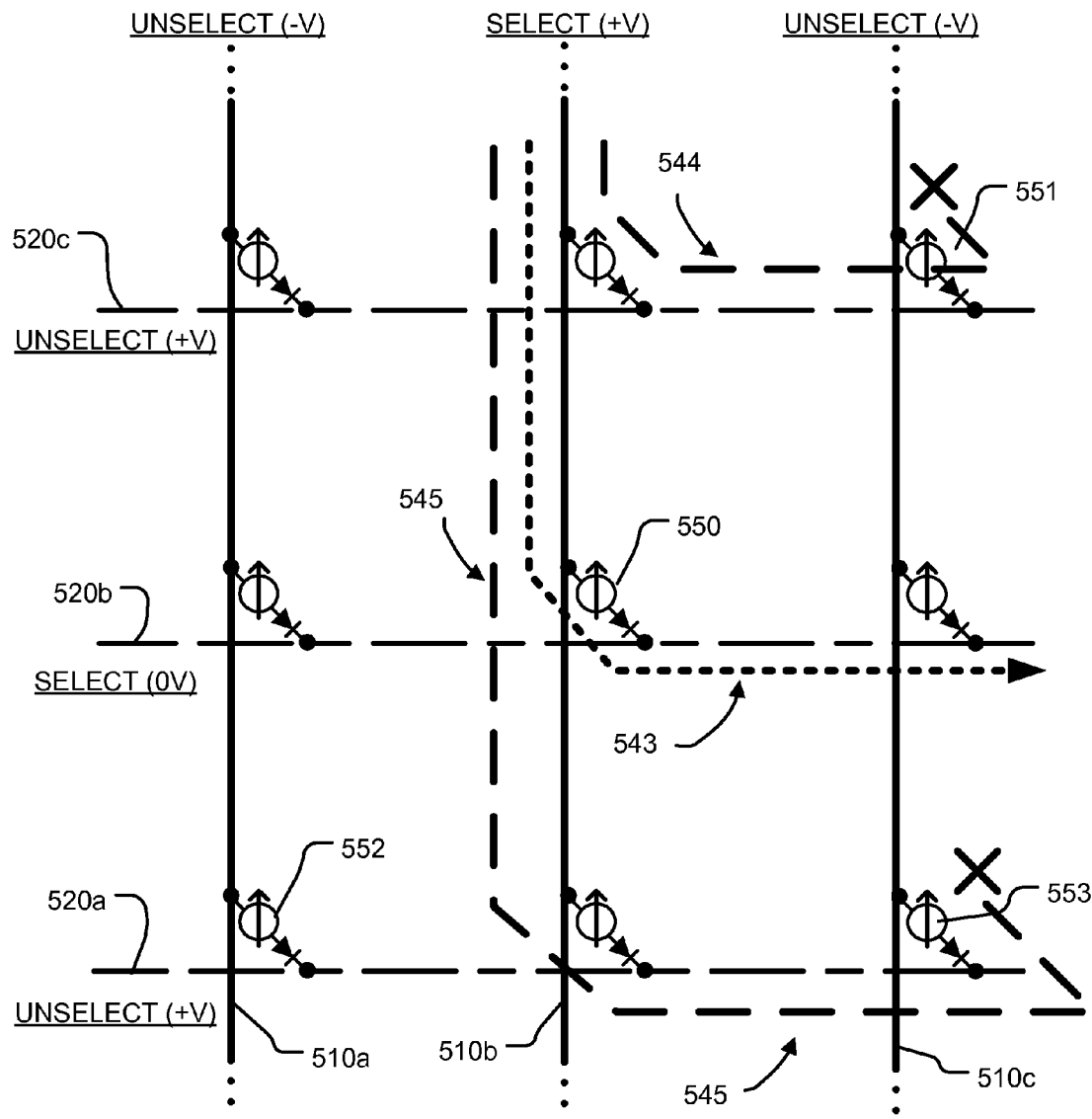
FIG. 5 is a circuit diagram of the configuration of PMC cells within a 1D/1R cross-point planar array structure.

Due to the unipolar operation characteristic, the PMC cell in this embodiment can be implemented in the "1D/1R" memory array structure. FIG. 5 is a schematic diagram of a cross-point memory array implemented using a "1D/1R" memory array, with a diode access device for each cell. As shown in FIG. 5, each of the memory cells (e.g., 550, 551, 552, 553) of the array 500 is represented by a resistive memory element and a diode along a current path between a corresponding bit line 510a-510c and a corresponding word line 520a-520c. The diodes form an access array with the word lines over which the memory cells can be formed. In alternative array structures, other access devices can be used, including field effect transistors and bipolar transistors.

The array comprises a plurality of bit lines 510a, 510b, and 510c extending in parallel in a first direction, and a plurality of word lines 520a, 520b, and 520c extending in parallel in a second direction perpendicular to the first direction. The array 500 is referred to as a cross-point array because the bit lines 510a-510c and word lines 520a-520c cross each other but do not physically intersect, and the memory cells with access devices are located at these cross-points.

Memory cell 550 is representative of the memory cells of array 500 and is arranged at the cross-point location of the "selected" bit line 510b and the "selected" word line 520b.

Reading or writing the memory cell 550 of array 500 can be achieved by applying appropriate voltage pulses to the corresponding bit line 510b and word line 520b to cause a set, reset or read bias condition at the selected memory cell 550, while applying appropriate inhibit voltages to the unselected bit lines and word lines. The level and duration of the voltages applied is dependent upon the operation performed, e.g. a read operation, a set operation and a reset operation. With a positive voltage applied to the selected bit line, and a lower voltage such as ground or zero volts applied to the word line, the diode in the cell 550 is forward biased allowing current flow in the cell. A current path 543 is therefore formed to a selected cell (e.g. cell 550) as illustrated. Unselected bit lines are biased with a negative voltage, or a voltage insufficient to turn on the diodes, relative to the selected word line. Unselected word lines can be biased with a positive voltage that is insufficient relative to the voltage on the selected bit line, to turn on the diodes. Leakage current through unselected cells in the array, such as represented by leakage current paths 544 and 545, is blocked as represented by the "X", because the diodes in the cells are reverse biased, blocking current flow in the cell.

An array implemented using cross-point cells as described herein, can have many layers, and many bit lines and word lines in each layer for formation of very high density memory devices. Other 3D configurations can be implemented, including a three-dimensional array in which the plurality of word lines and the plurality of bit lines are arranged for access to multiple levels of memory cells.

Figure 6:
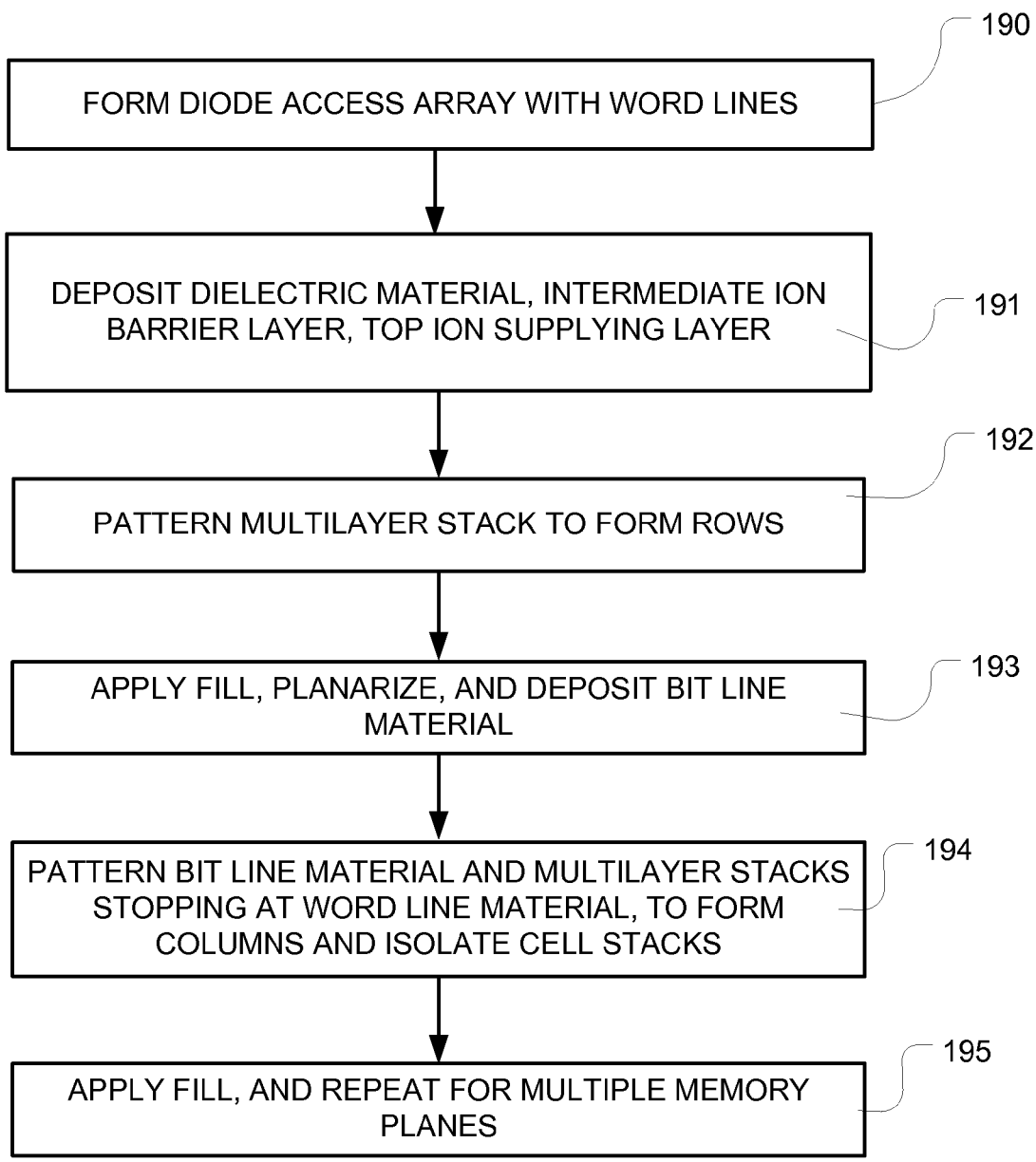
FIG. 6 shows a process flow chart of manufacturing of a PMC cell of the configuration shown in FIG. 1.

FIG. 6 shows a simplified process flow chart of the manufacturing of a PMC cell of the configuration shown in FIG. 2. In this example, word lines serve as bottom electrodes for a plurality of cells along a word line row. Thus, the process involves first forming an access array of diodes, or other access devices, including word lines (190) having a corresponding array contacts. Next, on top of an array of contacts (e.g. contact on the electrode 100) for the diodes, depositing a dielectric material, an intermediate conductive ion-barrier layer, and a top ion-supplying layer, such as described above with reference to FIG. 1 (191). Next, the multilayer stack is patterned to form rows (192). A fill material is applied and planarized, and then a bit line material is deposited over the structure (193). In a next step, the bit line material in the multilayer stacks is patterned, with a pattern etch stopping at or below the level of the array of contacts (194). This results in the formation of bit lines coupled to columns of memory cells, and to isolated cell stacks at the cross-points of the word lines and bit lines. Finally, a fill material is applied to complete a memory plane, and the process is repeated to form multiple planes of memory cells (195).

Figure 7:
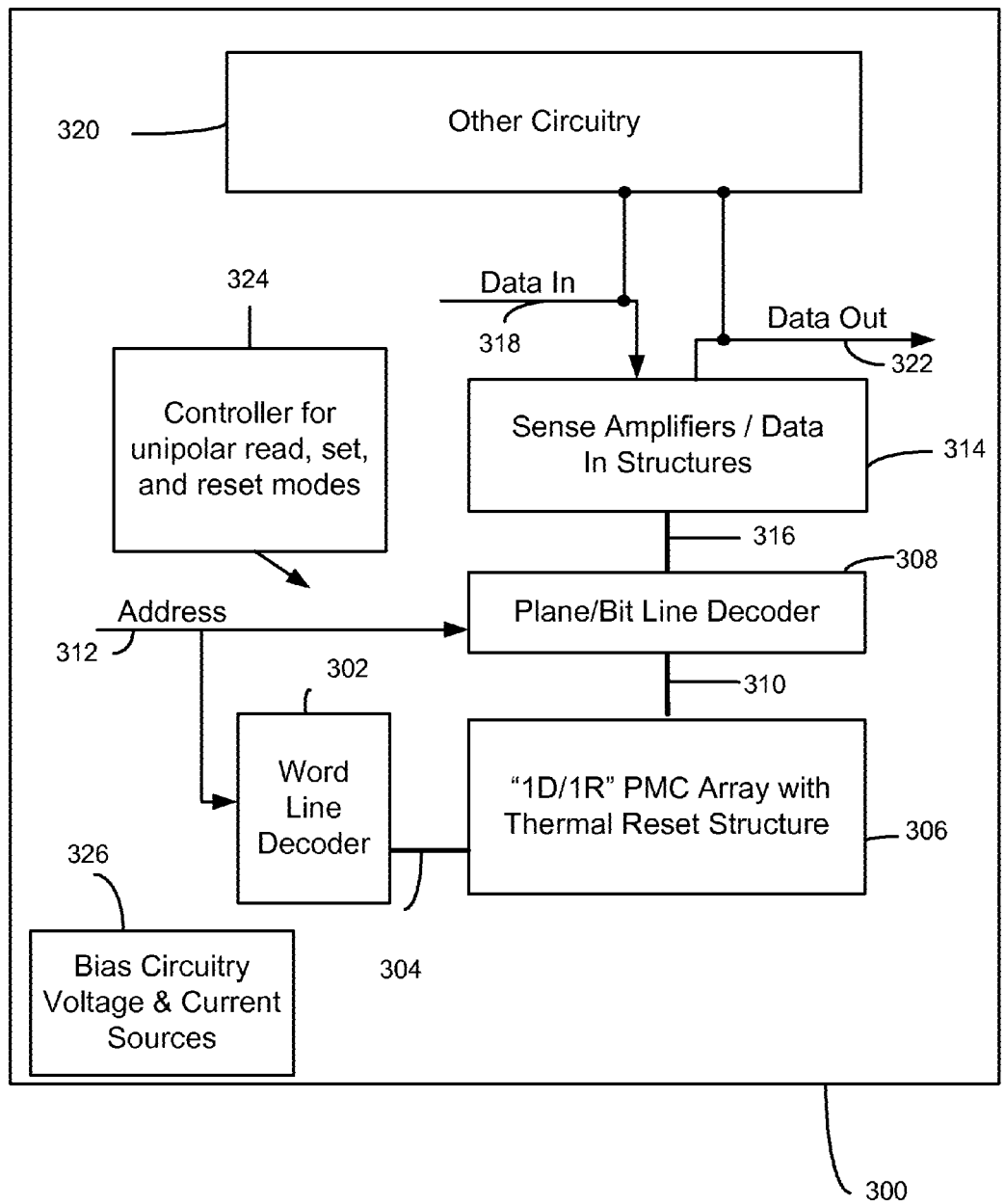
FIG. 7 is a simplified block diagram of an integrated circuit 300 including a memory array implemented using PMC cells as described herein.

FIG. 7 is a simplified block diagram of an integrated circuit 300 including a non-volatile memory array 306 implemented using an array of "1D/1R" PMC cells with a thermal reset structure. The integrated circuit can be configured for one-time programming, many-time programming, and resistive random access memory. The array can include diode-like access devices.

The integrated circuit 300 includes a word line decoder 302 coupled to and in electrical communication with a plurality of word lines 304 arranged along rows in the memory array 306. A bit line and (optional) plane decoder 308 is in electrical communication with a plurality of bit lines 310 arranged along columns in the array 306 and in a plurality of planes, for reading, setting, and resetting the memory cells in array 306. Addresses are supplied on bus 312 to word line decoder 302 and plane/bit line decoder 308. Sense circuitry (Sense amplifiers) and data-in structures in block 314, are coupled to plane/bit line decoder 308 via data bus 316. Data is supplied via a data-in line 318 from input/output ports on integrated circuit 300, or from other data sources internal or external to integrated circuit 300, to data-in structures in block 314. Other circuitry 320 may be included on integrated circuit 300, such as a general purpose processor or special purpose application circuitry, or a combination of modules providing system-on-a-chip functionality supported by array 306. Data is supplied via a data-out line 322 from the sense amplifiers in block 314 to input/output ports on integrated circuit 300, or to other data destinations internal or external to integrated circuit 300.

The integrated circuit 300 includes sense circuitry (in block 314) coupled to the array of memory cells to sense a resistance state of a selected memory cell.

A controller 324, implemented in this example using a bias arrangement state machine, controls the application of bias circuitry voltage and current sources 326 for the application of bias arrangements including set, reset and read voltages and/or currents for the word lines and bit lines. Controller 324 may be implemented using special-purpose logic circuitry as known in the art. In alternative embodiments, controller 324 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 324.

The control circuitry 324, 326 is coupled to the plurality of bit lines and the plurality of word lines to apply bias arrangements for operation of the memory cells, including circuitry to apply a first bias condition having a polarity between the first and second electrodes to induce creation of conducting bridges within the dielectric layer, and a second bias condition having said polarity to induce thermal disintegration of bridges in the dielectric layers. In one example, the control circuitry 324, 326 is coupled to the plurality of bit lines and the plurality of word lines, and configured to apply bias arrangements for operation of the memory cells, including:

a read bias arrangement to sense a resistance state of a selected memory cell;
  a first write bias arrangement having a polarity, to induce the formation of a bridge in the dielectric layer of a selected memory cell establishing a first resistance state in the selected cell; and
  a second write bias arrangement having said polarity to induce thermal disintegration of a bridge in the dielectric layer of a selected memory cell establishing a second resistance state.

Also, in an embodiment of the memory technology described herein, the array of memory cells comprises a three-dimensional array, and the plurality of word lines and the plurality of bit lines are arranged for access to multiple levels of memory cells in the three-dimensional array.

A method of operating an array of programmable metallization cells, is described herein in which the method has a read mode, that includes applying a read bias arrangement to sense a resistance state of a selected memory cell; the method has a first write mode, that includes applying a first write bias arrangement having a polarity to induce the formation of a bridge in the dielectric layer of a selected memory cell establishing a first resistance state; and the method has a second write mode, that includes applying a second write bias arrangement having said polarity to induce thermal disintegration of a bridge in the dielectric layer of a selected memory cell establishing a second resistance state.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising a programmable metallization cell including:
  a first electrode and a second electrode;
  a dielectric layer, a conductive ion-barrier layer, and an ion-supplying layer in series between the first and second electrodes, the ion-supplying layer containing a source of ions of a material suitable for formation of conductive bridges through the dielectric layer; and
  circuitry to apply, in a set operation, a first bias condition having a polarity between the first and second electrodes to cause current between the first and second electrodes having a direction to induce creation of conducting bridges within the dielectric layer, and to apply in a reset operation, a second bias condition having said polarity to cause current between the first and second electrodes having said direction to induce disintegration of bridges in the dielectric layer.

2. The memory device of claim 1, wherein the dielectric layer comprises a material or materials supporting electrolytic formation of conducting bridges therethrough using ions from the ion-supplying layer.

3. The memory device of 1, wherein the conductive ion-barrier layer comprises a material to block ion diffusion from the ion-supplying layer to the dielectric layer during the second bias condition, while allowing sufficient ion diffusion from the ion-supplying layer to the dielectric layer for formation of conductive bridges during the first bias condition.

4. The memory device of claim 1, wherein the conductive ion-barrier layer comprises a nitrogen-containing conductive material.

5. The memory device of claim 1, wherein the conductive ion-barrier layer comprises a metal nitride.

6. The memory device of claim 1, wherein the ion-supplying layer comprises a source of copper ions.

7. The memory device of claim 1, wherein the ion-supplying layer comprises a source of silver ions.

8. The memory device of claim 1, wherein the ion-supplying layer comprises a material including copper and tellurium.

9. The memory device of claim 1, wherein the ion-supplying layer comprises a material including a chalcogenide and at least one of copper and silver.

10. The memory device of claim 1, wherein the memory device includes a plurality of cells, including said programmable metallization cell, configured in a cross-point array.

11. The memory device of claim 1, wherein the dielectric layer comprises one or more materials selected from a group including dielectric oxides and dielectric nitrides, the conductive ion-barrier layer comprises one or more materials from a group including metal nitrides, and the ion-supplying layer comprises one or more materials selected from a group including copper or silver containing chalcogenides.

12. An integrated circuit, comprising:
a plurality of bit lines and a plurality of word lines;
an array of memory cells and a corresponding array of access devices, coupled to the plurality of bit lines and the plurality of word lines, the memory cells in the array respectively including a dielectric layer, a conductive ion-barrier layer, and an ion-supplying layer in series between corresponding word lines and bit lines; and
sense circuitry coupled to the array of memory cells, to sense whether a selected memory cell has a threshold below a read threshold;
control circuitry coupled to the plurality of bit lines and the plurality of word lines to apply bias arrangements for operation of the memory cells, including:
 a read bias arrangement to sense a resistance state of a selected memory cell;
 a first write bias arrangement to induce the formation of a bridge in the dielectric layer of a first selected memory cell establishing a first resistance state in the first selected memory cell, the first write bias having a polarity between a word line and a bit line connect to the first selected memory cell and inducing a current having a direction through the first selected memory cell; and
 a second write bias arrangement to induce disintegration of a bridge in the dielectric layer of a second selected memory cell establishing a second resistance state in the second selected memory cell, the second write bias having a polarity between a word line and a bit line connect to the second selected memory cell and inducing a current having said direction through the second selected memory cell.

13. The integrated circuit of claim 12, wherein the array of access devices comprises one diode for each memory cell.

* * * * *